United States Patent [19]
Ueno

[11] Patent Number: 5,696,017
[45] Date of Patent: Dec. 9, 1997

[54] METHOD OF FABRICATING A SEMICONDUCTOR DEVICE WITH A CAPACITOR STRUCTURE HAVING INCREASED CAPACITANCE

[75] Inventor: Kazuyoshi Ueno, Tokyo, Japan

[73] Assignee: NEC Corporation, Tokyo, Japan

[21] Appl. No.: 363,883

[22] Filed: Dec. 27, 1994

[30] Foreign Application Priority Data

Dec. 28, 1993 [JP] Japan ................... 5-338592

[51] Int. Cl.$^6$ ................... H01L 21/70; H01L 27/00
[52] U.S. Cl. ................... 437/60; 437/52; 437/919
[58] Field of Search ................... 437/47, 52, 60, 437/919, 977, 200

[56] References Cited

U.S. PATENT DOCUMENTS

| | | | |
|---|---|---|---|
| 5,168,073 | 12/1992 | Gonzalez et al. | 437/47 |
| 5,279,985 | 1/1994 | Kamiyama | 437/60 |
| 5,392,189 | 2/1995 | Fazau et al. | 361/305 |
| 5,498,562 | 3/1996 | Dennison et al. | 437/52 |

OTHER PUBLICATIONS

"Rugged Surface Poly–Si Electrode and Low Temperature Deposited $Si_3N_4$ for 64Mbit and Beyond STC DRAM Cell," M. Yoshimaru et al., Technical Digest of IEDM, Dec. 1990, pp. 659–662.

"A Capacitor–Over–Bit–Line (COB) Cell with a Hemispherical–Grain Storage Node for 64Mb DRAMs," M. Sakao et al., Technical Digest of IEDM, Dec. 1990, pp. 655–658.

"A Corrugated Capacitor Cell (CCC) for Megabit Dynamic MOS Memories," H. Sunami et al., Techical Digest of IEDM, Dec. 1982, pp. 806–808.

"Novel High Density, Stacked Capacitor MOS RAM," M. Koyanagi et al., Technical Digest of IEDM, Dec. 1978, pp. 348–351.

"3–Dimensional Stacked Capacitor Cell for 16M and 64M DRAMS," T. Ema et al., Technical Digest of IEDM, Dec. 1988, pp. 592–595.

Primary Examiner—Jey Tsai
Attorney, Agent, or Firm—Young & Thompson

[57] ABSTRACT

A semiconductor integrated circuit device with a capacitor structure having a large capacitance per unit surface is disclosed, wherein a contact hole is formed in an insulator layer, a metal electrode with or without a rugged surface is formed in the contact hole by an ion beam vapor deposition of metal, and a capacitor insulator layer is formed on a surface of the metal electrode. The metal electrode is integral with a contact metal. The capacitor structure comprises the metal electrode integral with the contact metal and the capacitor insulator layer which are buried in the contact hole. The device is improved in planarization, reduction of parasitic resistance, maintenance of capacitance and mass production ability.

7 Claims, 6 Drawing Sheets

METHOD OF FABRICATING A SEMICONDUCTOR DEVICE WITH A CAPACITOR STRUCTURE HAVING INCREASED CAPACITANCE

BACKGROUND OF THE INVENTION

(1) Field of the Invention

The present invention relates to a semiconductor integrated circuit device, and more particularly to a semiconductor integrated circuit device and a method for fabricating such a device, wherein capacitance per unit surface area can be increased.

(2) Description of the Related Art

Dynamic random access memory (DRAM) is used in electronic equipment such as personal computers, and there is continuing improvement of the integration density. The memory cell, which is a unit of memory of a DRAM, is composed of one switching transistor and one capacitor. In order to improve the integration density of the DRAM, the increase in surface area due to improvements in integration density must be prevented, and from the point of view of improving transistor performance, a reduction of the cell size is necessary to increase the cell density per unit area. On the other hand, in order to store and hold a signal for maintaining memory operation of a DRAM, it is necessary for the DRAM to have a charge storage capacity greater than a predetermined value. As a standard, a capacitance of about 30 fF is usually accepted as being necessary. The storage capacitance is determined by the surface area of the capacitor electrode and the dielectric constant of the capacitor layer. Silicon oxide layers (relative dielectric constant thereof being 4.2) have mainly been used as capacitor layers. Also, silicon nitride layers, tantalum oxide ($Ta_2O_5$) layers, titanium strontium oxide or lead zirconium titanium oxide (PZT) etc., which are ferroelectric layers, have been considered, but from the point of view of matching with materials used in conventional processing, only silicon oxide layers are used in practice. Thus, conventionally, ideas about electrode structure design and surface area enlargement have exclusively been used in order to reduce memory size and to maintain the necessary capacity. For example, the trench structure shown in the Technical Digest of IEDM, p.806, (December 1982), the stack structure which gains a surface area in the vertical direction, as shown in the Technical Digest of IEDM, p.348, (December 1978), or the fin structure which is a modification of these structures, as shown in the Technical Digest of IEDM, p.592 (December 1988), and the rugged surface electrode structure as shown in the Technical Digest of IEDM p.659 (December 1990) and the Technical Digest of IEDM p.655 (December 1990) have been developed.

It is becoming difficult to conceive of ideas for increasing surface area of the capacitor electrode structure by using conventional technology for DRAM of greater than 256 mega-bit integration level. That is, since the surface area increases, the size of the capacitor electrode in the vertical direction increases and, with the enhanced integration density giving multiplication effects, the aspect ratio inevitably becomes large, and this is accompanied by difficulties in formation of electrodes and interconnections between transistors. Also, an electrode with a large aspect ratio leads to an increase in the surface roughness of the electrode after its formation, thereby giving rise to various problems such as a difficulty in the subsequent interconnection formation or a reduction of reliability.

Further, because polysilicon is conventionally used as the material for the capacitor electrodes, there are problems, due to the high resistivity of polysilicon, that electrode resistance and contact plug resistance become high by size reductions.

It is desirable to use, as a capacitor layer, other materials whose dielectric constant is higher than that of the silicon oxide layer to solve the aforementioned problems, but it is difficult to introduce lead, zirconium etc., into silicon processing because impurity control is the main factor affecting device fabrication yield, and materials containing these elements are hardly ever used in the processing of silicon. Thus, it is required to fabricate devices within the limits of conventionally used materials.

SUMMARY OF THE INVENTION

An object of the present invention, therefore, is to overcome the problems existing in the prior art and to provide a semiconductor integrated circuit device whose capacitance per unit surface area can be increased.

The invention disclosed relates to the three kinds of structures of a semiconductor integrated circuit device, as follows;

A first structure (hereinafter referred to as a "first semiconductor integrated circuit device") is a semiconductor integrated circuit device which comprises a metal electrode electrically connected to a semiconductor substrate and a capacitor insulating layer on a surface of the metal electrode in a DRAM.

Where the first semiconductor integrated circuit device of this invention is used as the memory cell of a DRAM, since the electrode metal is simultaneously formed as a contact electrode for connection with the silicon diffusion layer below and with a capacitor electrode, the advantage is that the processing stages can be reduced. In addition, since such an electrode is made of a metal, it has a lower resistance than that in conventional polysilicon so that the effect of the parasitic resistance can be reduced. In practice, there is a problem of an increased resistance if an ultra-fine contact less than 0.25 μm is formed with polysilicon. This invention offers a solution to this problem (FIGS. 1A–1E).

A second one (hereinafter referred to as a "second semiconductor integrated circuit device") is a semiconductor integrated circuit device in which a capacitor is formed only within a periphery of a contact hole provided in an insulating layer (FIGS. 2A–2B).

The second semiconductor integrated circuit device has the effect of a countermeasure for suppressing the serious problem of increasing steps as a result of miniaturization. That is, because the capacitor is formed only inside the contact hole formed in the insulator layer or only inside a trench that includes the contact hole, it is possible to attain planarization after deposition of an upper section electrode metal of the capacitor.

A third structure (hereinafter referred to as a "third semiconductor integrated circuit device") is a semiconductor integrated circuit device in which the capacitor electrode of metal has a rugged surface. (FIGS. 4A–4C)

In the third semiconductor integrated circuit device, the rugged surface of the electrode metal constituting the lower electrode of the capacitor has the effect of effectively increasing the capacitance due to the effective increase of the surface area, and this effect is greater than the effective increase of surface area of a conventional polysilicon electrode. This is because, in the case of conventional hemispherically shaped polysilicon grains, the spherical surface growth is, in principle, isotropical due to thermodynamic surface energy equilibrium, and the increase in the effective surface area is thus limited so that the capacitance increase is a factor of about 1.6. However, in the case of the third semiconductor integrated circuit device of this invention, the unevenness of the metal electrode surface is as a result of the growth of anisotropic pillar shaped grains during metal deposition and, since these grains can be grown so that they are scarce at the contact side wall and so that neighboring grains are not in contact, there is a larger increase of the effective area than isotropically grown spherical grains. Further, according to the fabrication method of the second semiconductor integrated circuit device of this invention, the rugged electrode metal is formed at the same time as the deposition of the metal so that, unlike in conventional rugged polysilicon electrodes which require several processes such as deposition of silicon and annealing or deposition of silicon and etching, the process steps are simplified with the effect of a reduction of fabrication costs and an improvement of yield.

Further, for the first, second, and third semiconductor integrated circuit devices described above, the metals such as TiN, TaN, etc., are used as the lower capacitor electrodes, and capacitor insulator layers having good complimentary properties with these metals are used. For example, in the case where rutile ($TiO_2$) is used with respect to a TiN electrode metal, it is better than using a conventional polysilicon electrode because it includes the same element and has better complimentary properties. The dielectric constant of rutile is a factor of 30 larger than $SiO_2$, and this proportional difference makes the merit of using rutile large from the point of view of easing the restrictions of the capacitor insulator thickness or increase in the surface area. In the semiconductor integrated circuit devices described above, even where the rugged surface is not provided, if a 10 nm thick layer of rutile is formed only inside the contact hole whose diameter is 0.25 μm and depth is 0.6 μm, a capacitance of 50 fF can be attained and realize the capacitance necessary for a DRAM cell. In addition, even if the diameter of the contact hole is reduced to 0.15 μm, a capacitance of 30 fF can be attained and a 1 giga-bit DRAM can be realized.

Also, from the materials perspective, the combination of a TiN electrode and rutile ($TiO_2$) in the semiconductor integrated circuit device of this invention has the merit in that it is the easiest combination and that, in the same way that a conventional combination of a Si electrode and $SiO_2$ has a stable structure and has been widely used, the materials used in this invention are composed of only a small number of constituent elements and have been well tested in conventional Si LSI structures. This is significant because, in Si LSI structures, from the point of view of suppressing impurities in order to improve fabrication yield, it is better if the use of the elements has been experienced more conventionally and the number of the elements is more limited.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF PREFERRED EMBODIMENTS

Now, preferred embodiments of the invention will be explained with reference to the drawings.

Figure 1A:
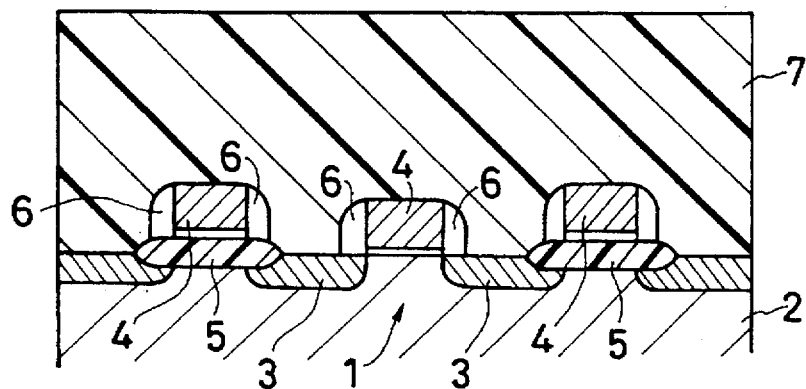
FIGS. 1A–1E are diagrammatic sectional views of the first semiconductor integrated circuit device for use in explaining the process steps for fabricating such a device according to the invention.

FIGS. 1A–1E show the cross-sectional diagrams of the first semiconductor integrated circuit device according to the invention. As shown in FIG. 1A, a memory cell constituted by a MOS transistor 1 is fabricated on a silicon substrate 2. The MOS transistor is composed of a diffusion layer 3 constituting the source and drain, and a gate electrode 4, and is electrically insulated by a device isolation layer 5 from neighboring gate electrodes or diffusion layers of a transistor. Also, a side wall 6 composed of a silicon oxide layer and a silicon nitride layer is provided at the side surface of the gate electrode 4. Furthermore, the transistor is covered with an interlayer insulator layer 7 composed of silicon oxide etc., and as shown in FIG. 1A, in the case of this embodiment, the interlayer insulator layer surface is planarized. The planarization is carried out by etch-back using reactive ion etching (RIE) or chemical mechanical polishing (CMP). Although planarization is carried out in this case, it is also acceptable if the planarization is not carried out. The gate width of the gate electrode is 0.2 μm and the thickness of the interlayer insulator layer is 0.6 μm.

Figure 1B:
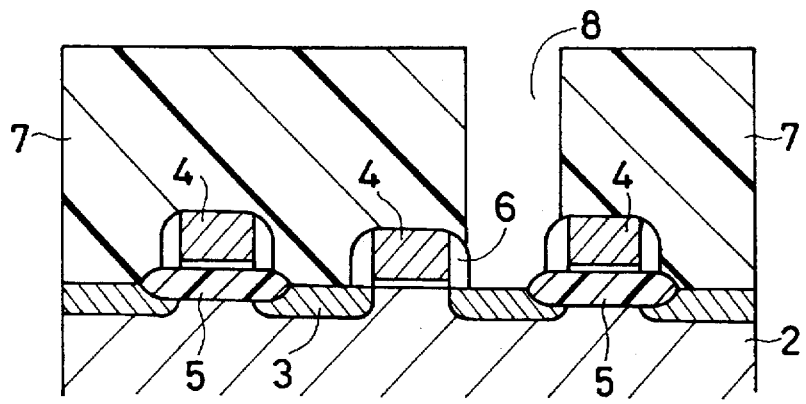

Next, as shown in FIG. 1B, a contact hole 8 having a diameter of 0.25 μm is formed in the interlayer insulator layer 7 by standard photolithography and RIE of the oxide layer.

Figure 1C:
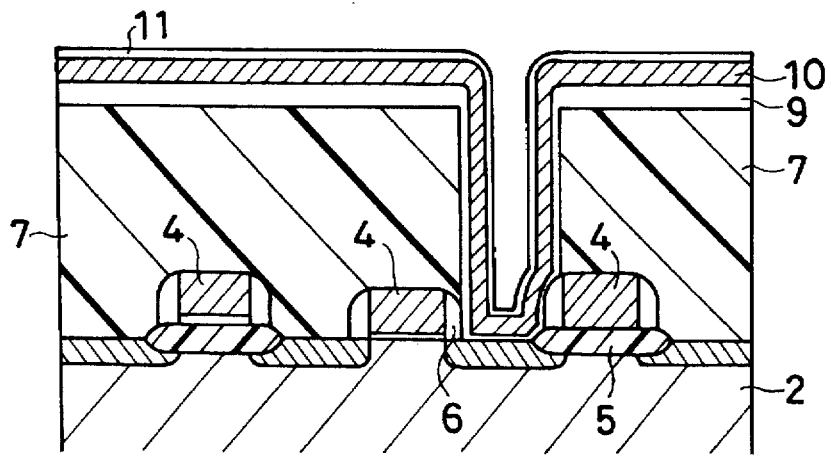
Figure 1D:
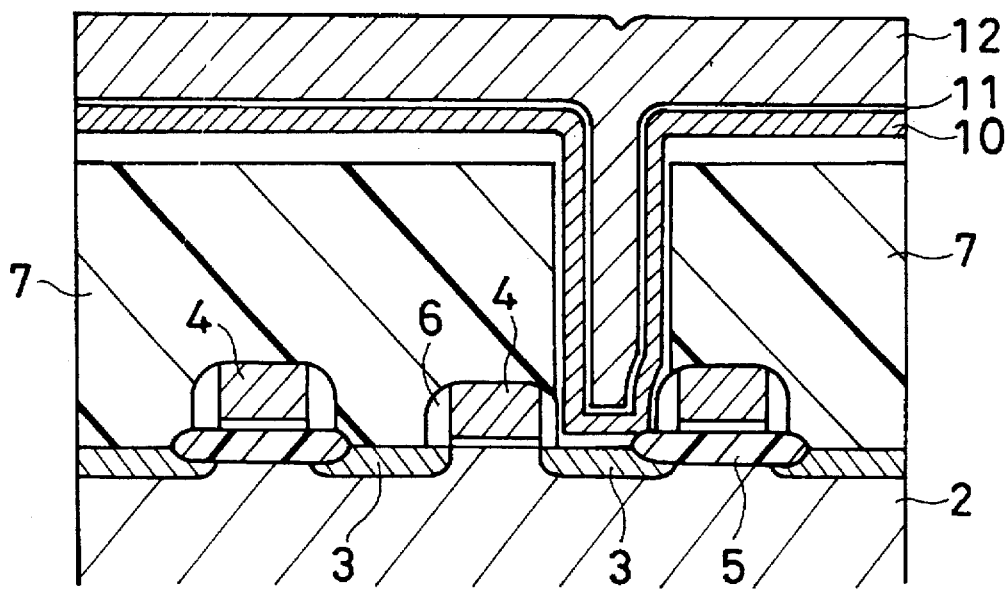

Next, as shown in FIG. 1C, a contact metal (Ti) 9 is deposited by collimated sputtering over the entire surface and, with a layer of sufficient thickness being deposited in the bottom of the contact hole, a titanium silicide is formed by a reaction with the Si below. Following this, a titanium nitride film of a thickness of only 50 nm is deposited as an electrode metal 10. The titanium nitride is deposited by metalorganic chemical vapor deposition (MOCVD) using tetrakisdiethylamido titanium (TDEAT) or tetrakisdimethylamido titanium (TDMAT) as sources. Next, a tantalum pentaoxide ($Ta_2O_5$) film of a thickness of only 10 nm is deposited by the CVD method on the TiN as a capacitor insulator layer 11.

Next, as shown in FIG. 1D, once again, an upper electrode metal (TiN) 12 is deposited on the capacitor insulator layer by MOCVD using TDEAT or TDMAT.

Figure 1E:
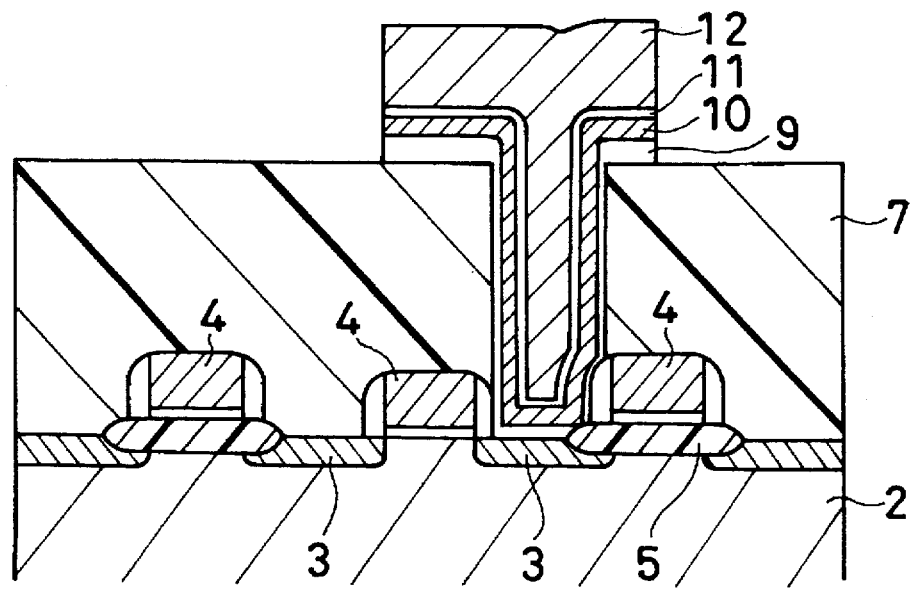

Next, as shown in FIG. 1E, the upper electrode metal 12, the capacitor insulator layer 11, the electrode metal 10, and the contact metal 9 are processed and patterned using the well known technology of photolithography and RIE.

The first semiconductor integrated circuit device of this invention made in this way is used as a memory cell of a DRAM.

For the embodiment described here, an example of a contact metal 9 using Ti was shown, but it is also acceptable to use Ta, W, Mo, Pt, Co, Ni, etc., instead of Ti. Furthermore, other silicides such as, titanium silicide, tantalum silicide, tungsten silicide, molybdenum silicide, cobalt silicide CoSi, NiSi, etc., are also acceptable.

Further, for the embodiment described here, TiN was used as the electrode metal 10, but instead of TiN, it is also acceptable to use metal nitrides such as, tungsten nitride (WN), molybdenum nitride (MoN), etc., or alloys such as, titanium tungsten (TiW), tungsten silicide (WSi) etc., or nitrides of these, such as, TiWN, WSiN, etc.

Further, for the embodiment described here, $Ta_2O_5$ was used as the capacitor insulator layer 11, but instead of $Ta_2O_5$, it is also acceptable to use rutile ($TiO_2$), strontium titanium oxide ($SrTiO_3$), zirconium titanium oxide lead (PZT), etc. In the case where the rutile is used, as described later, the process stages can be reduced by using TiN as the electrode metal and by oxidizing its surface whereby yield is increased. Also, the possibility of practical applications is enhanced because the electrode metal and the capacitor insulator layer can be formed only with Ti which is a well known material and in which previous results are available in the field of Si LSI processing.

The capacitance formed in this embodiment is about 10 fF inside the contact hole alone because the dielectric constant of $Ta_2O_5$ is about a factor of 6 greater than that of a conventional silicon nitride layer. In the case where the rutile is used, it is about 50 fF inside the contact hole only, and in this case the capacitance required for a memory cell is satisfied by the capacitance inside the contact hole only. In the case where the capacitance is formed inside the contact hole only, the surface after memory cell formation can be planarized, and the processing after interconnection formation is made easier. This kind of structure is the second semiconductor integrated circuit device of this invention that will be explained next.

Next, the second semiconductor integrated circuit device of this invention will be explained below using the cross-sectional diagrams thereof.

FIGS. 2A–2D are process cross-sectional diagrams used in order to explain the second semiconductor integrated circuit device of this invention.

First, in the same way as in the first semiconductor integrated circuit device of this invention as shown in FIG. 1A, a MOS transistor 1 constituting a memory cell is fabricated on a silicon substrate 2. The MOS transistor is composed of a diffusion layer 3 constituting the source and drain, and a gate electrode 4, and is electrically insulated by a device isolation layer 5 from neighboring gate electrodes or diffusion layers of a transistor. Also, a side wall 6 composed of a silicon oxide layer and a silicon nitride layer is provided at the side surface of the gate electrode 4. Furthermore, the transistor is covered with an interlayer insulator layer 7 composed of silicon oxide, etc., and as shown in FIG. 1A, in the case of this embodiment, the interlayer insulator layer surface is planarized. The planarization is carried out by etch-back using reactive ion etching (RIE) or chemical mechanical polishing (CMP). Although planarization is carried out in this case, it is also acceptable if the planarization is not carried out. The gate width of the gate electrode is 0.2 μm and the thickness of the interlayer insulator layer is 0.6 μm.

Next, as shown in FIG. 1B, a contact hole 8 having a diameter of 0.25 μm is formed in the interlayer insulator layer 7 by standard photolithography and RIE of the oxide layer.

Figure 2A:
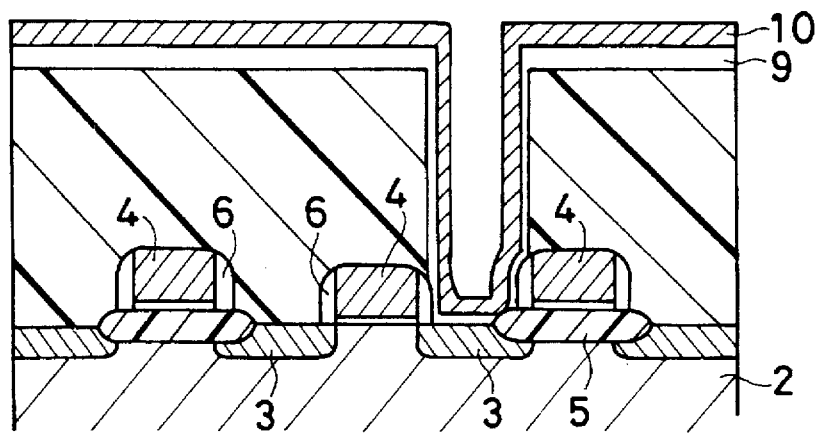
FIGS. 2A–2D are diagrammatic sectional views of the second semiconductor integrated circuit device for use in explaining the process steps for fabricating such a device according to the invention.

Next, as shown in FIG. 2A, a contact metal (Ti) 9 is deposited by collimated sputtering over the entire surface and, with a layer of sufficient thickness being deposited in the bottom of the contact hole, a titanium silicide is formed by a reaction with the Si below. Following this, a titanium nitride film of a thickness of only 50 nm is deposited as an electrode metal 10. The titanium nitride is deposited by metalorganic chemical vapor deposition (MOCVD) using tetradiethylamino titanium (TDEAT) or tetradimethylamino titanium (TDMAT) as sources.

Figure 2B:
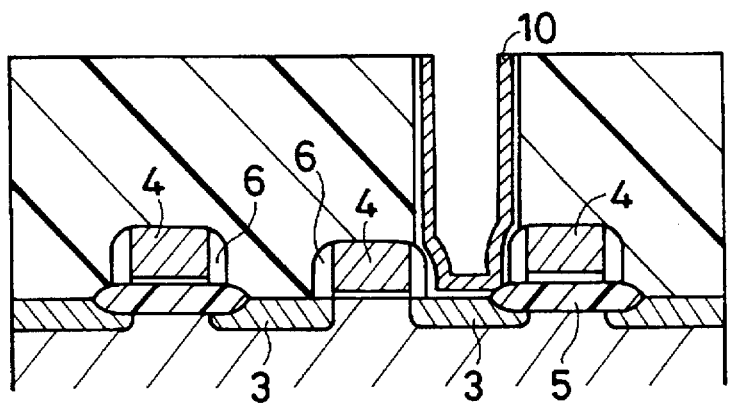

Next, as shown in FIG. 2B, the electrode metal 10 and the contact metal 9, except those inside the contact hole 8, are removed by chemical mechanical polishing (CMP). In this case, the structure as shown in FIG. 2B may be formed also by a process wherein photoresist is applied to the entire surface, the contact hole is filled and planarized and, after etch-back removal of the photoresist, the electrode metal 10 and the contact metal 9 by RIE or argon ion milling, the photoresist is dissolved and removed by an organic solvent.

Figure 2C:
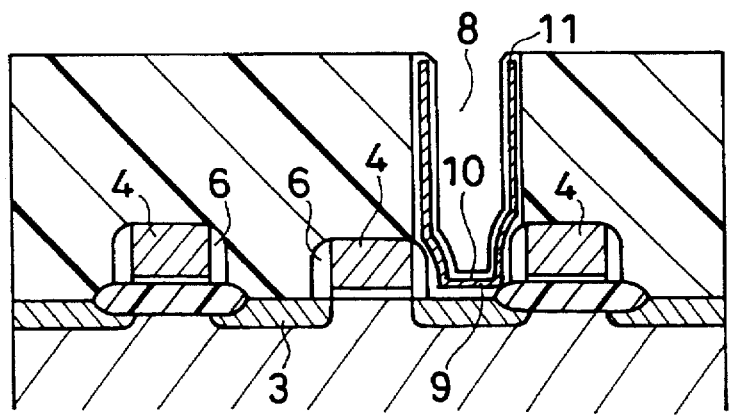

Next, as shown in FIG. 2C, the capacitor insulator layer (rutile) 11 is formed on the surface of the metal 12 electrode 10 and the contact metal. The capacitor insulator layer is heat processed in an electric furnace or a lamp furnace in an oxygen ambient at a temperature above 500° C., and a layer of 10 nm thickness is formed. At this time, it is necessary to oxidize not only the surface of the metal electrode 10 but also the surface of the contact hole opening of the contact metal 9 whereby an insulator layer is formed.

Figure 2D:
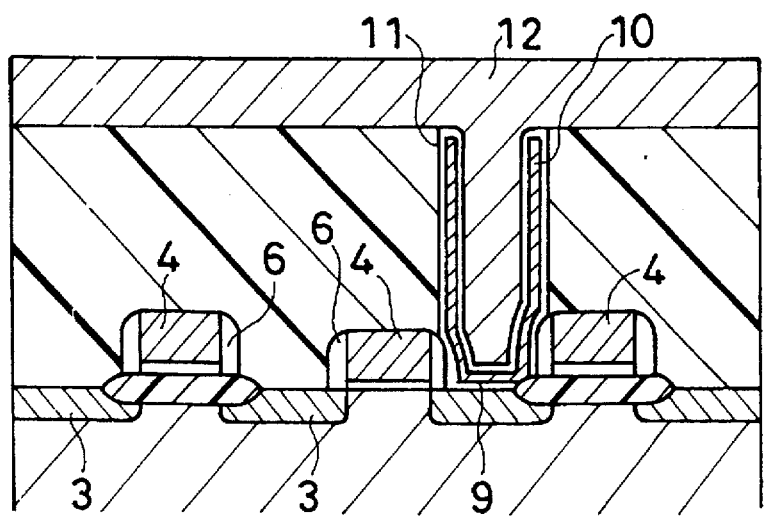

Next, as shown in FIG. 2D, as the upper electrode metal, the contact hole is filled by depositing TiN of a thickness of only 200 nm by the MOCVD method.

The second semiconductor integrated circuit device fabricated in this way constitutes a memory cell of a DRAM, and can maintain a capacitance of 50 fF. Also, in the case where a capacitance value of 30 fF is sufficient, it is acceptable to further reduce the thickness of the interlayer insulator layer 7 to 3/5 of that according to this embodiment.

Figure 3:
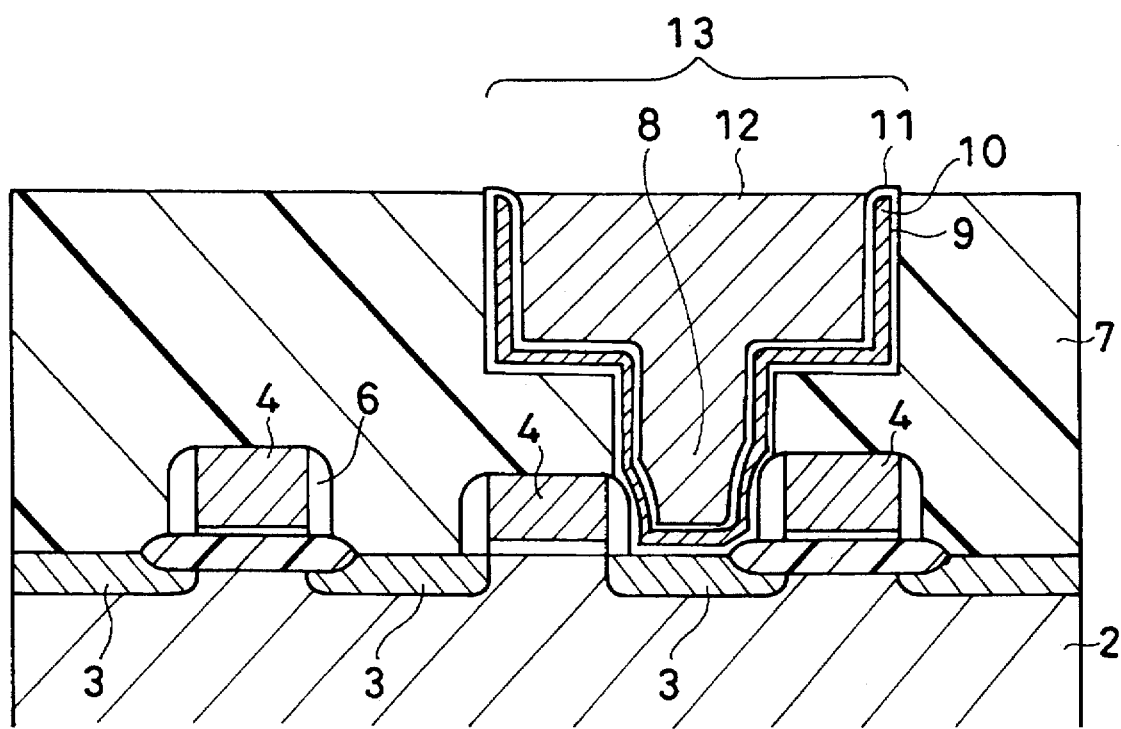
FIG. 3 is a diagrammatic sectional view of a modification of the second semiconductor integrated circuit device for explaining a part of the processes steps for fabricating such a device according to the invention.

Further, in this embodiment, the capacitor insulator layer is formed in the contact hole only, but it is acceptable to form the capacitor insulator layer only inside a trench 13 of various shapes formed in an insulator layer that includes the contact hole, as shown in the crosssectional structural diagram of FIG. 3. This is effective, in this case, when the capacitance value is insufficient because the area of the trench side surface can be increased.

Further, in this embodiment, the capacitor insulator layer of rutile is formed by the oxidation of the electrode metal that is composed of tantalum nitride, but in the same way, it is also acceptable to form tantalum pentaoxide by the oxidation of Ta or TaN instead of the rutile. Also, it is acceptable to deposit rutile, $Ta_2O_5$, $SrTiO_3$, PZT, etc., by the CVD method without using a method as used for fabricating the third semiconductor integrated circuit device explained later. However, in this case, in the same way as in this embodiment, it is necessary to carry out insulation processing by surface oxidation, etc. after the etch-back subsequent to the formation of the capacitor insulator layer so as to ensure that the pair of electrode metals sandwiching the capacitor insulator layer are insulated from each other.

Also, in this embodiment, Ti is used as the contact metal, but it is acceptable to use metals such as Ta, W, Mo, Pt, etc., or silicide alloys such as TaSi, TiSi, WSi, PtSi, MoSi, etc., or alloys such as Ti-Ta, etc.

Also, it is acceptable to use W, Mo, TiW, Pt, WN, MoN, TiWN, WSi, WSiN, etc., instead of TiN as the upper electrode metal.

Next, the third semiconductor integrated circuit device of this invention will be explained with reference to the cross-sectional diagrams for steps of the fabrication process thereof.

Figure 4A:
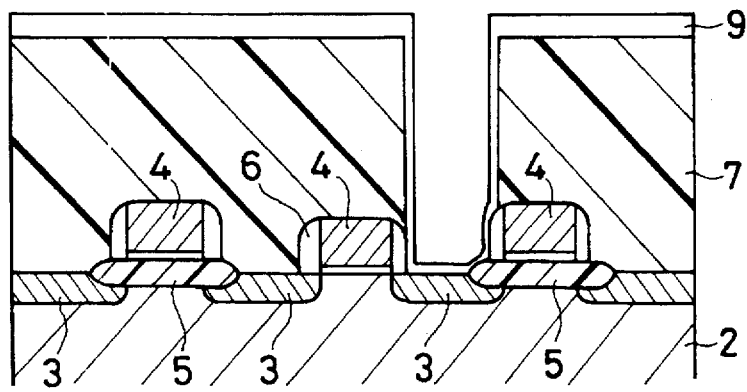
FIGS. 4A–4C are diagrammatic sectional views of the third semiconductor integrated circuit device for use in explaining the process steps for fabricating such a device according to the invention.
Figure 4B:
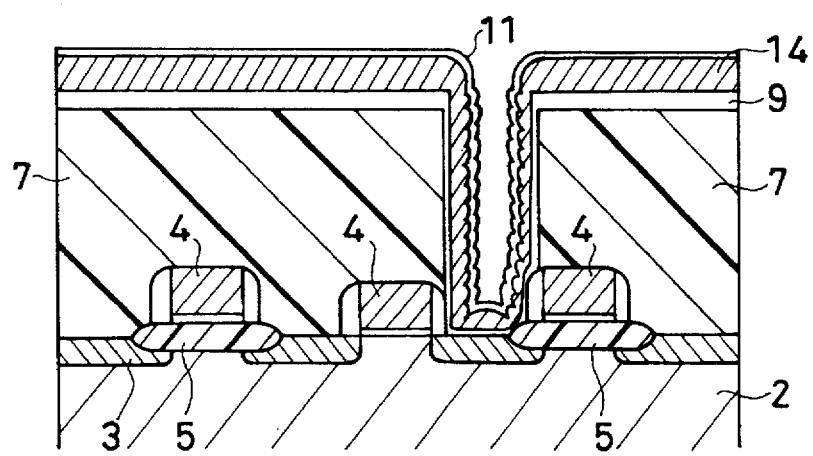
Figure 4C:
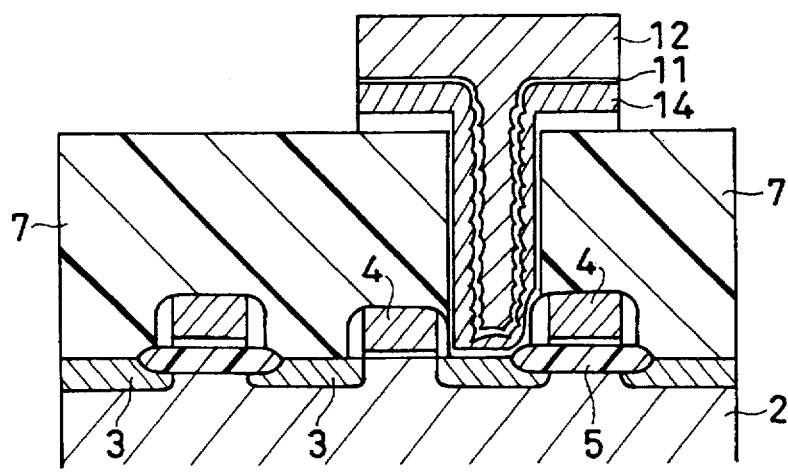

FIGS. 4A–4C are cross-sectional diagrams for process steps of the third semiconductor integrated circuit device of this invention.

First, as shown in FIG. 1A, a memory cell constituted by a MOS transistor 1 is fabricated on a silicon substrate 2. The MOS transistor is composed of a diffusion layer 3 constituting a source/drain and a gate electrode 4, and is electrically insulated by a device isolation layer 5 from neighboring gate electrodes or diffusion layers of a transistor. Also, a side wall 6 composed of a silicon oxide layer and a silicon nitride layer is provided at the side surface of the gate electrode 4. Furthermore, the transistor is covered with an interlayer insulator layer 7 composed of silicon oxide etc., and as shown in FIG. 1A, in the case of this embodiment, the interlayer insulator layer surface is planarized. The planarization is carried out by etchback using reactive ion etching (RIE) or chemical mechanical polishing (CMP). Although planarization is carried out in this case, it is also acceptable if the planarization is not carried out. The gate width of the gate electrode is 0.2 μm and the thickness of the interlayer insulator layer is 0.6 μm.

Next, as shown in FIG. 1B, a contact hole 8 having a diameter of 0.25 μm is formed in the interlayer insulator layer 7 by standard photolithography and RIE of the oxide layer. The above process is the same as that for the first and the second semiconductor integrated circuit device of this invention.

Next, as shown in FIG. 4A, a contact metal (Ti) 9 is deposited by collimated sputtering over the entire surface and, with a layer of a sufficient thickness being deposited in the bottom of the contact hole, and titanium silicide is formed by a reaction with the Si below.

Next, a rugged electrode metal (TIN) 14 is formed by ionized beam vapor deposition. In ionized beam deposition, for example, titanium (Ti) is used as the source, is evaporated in a vacuum chamber, and is made to collide with electrons so as to be made into positive ions, whereby a negative voltage is applied to the substrate. By doing this, the ionized Ti is given directionality by the electric field, and travels flying in a perpendicular direction (parallel to the contact hole) with respect to the substrate. Also, nitrogen is introduced into the evaporation chamber, which reacts with Ti and TiN is deposited on the substrate. In this case, according to experiment, TiN is deposited as a rugged pillar shape inside the contact hole as shown in FIG. 4B. Next, the capacitor insulator layer 11 that is composed of $Ta_2O_5$ is deposited to a thickness of only 10 nm on the rugged surface of metal electrode 14.

In the process for forming the series of contact metals and rugged electrode metals of FIG. 4A and 4B, instead of the deposition of the contact metal (Ti) 9 and the rugged electrode metal (TiN) 14, it is also acceptable to carry out the processes simultaneously for the formation of the rugged TiN electrode metal and the silicide by nitridation of the surface of Ti, wherein the rugged electrode metal layer composed of Ti is deposited using ionized evaporation, so as to be the contact metal and metal electrode, and then is heat treated at about 700° C. in a nitrogen ambient.

Next, the upper section metal electrode (TIN) 12 is deposited by MOCVD of TiN so that it covers the capacitor insulator 11 of FIG. 4B, followed by the patterning of the upper section metal electrode 12, the capacitor insulator layer 11, and the contact metal by using the well known technology of photolithography and dry etching. This completes the fabrication of the embodiment of the third semiconductor integrated circuit device of this invention. This device operates as a DRAM memory cell. In this structure, as described previously, by forming the capacitor contact using a metal, the parasitic resistance is reduced and, further as a result of the increase of the effective surface area due to the rugged electrode metal surface, the capacitance is increased by a factor of 2 compared with the case where there is no rugged surface in the electrode metal. Conventionally, an increase in the effective surface area using growth of polysilicon sphere shaped grains is known. In this case, the silicon grains, in principle, grow as isotropic spherical surfaces in order to maintain thermodynamic surface energy equilibrium, and the increase in the effective surface area is thus limited which in turn limits the capacitance increase to a factor of about 1.6. However, according to the fabrication method of this invention, since use is made of the roughness of the electrode metal surface as a result of the growth of anisotropic pillar shaped grains during metal deposition and these grains can be grown so that they are scarce at the contact side wall and so that neighboring grains are not in contact, there is a larger increase of the surface area than that of the isotropic sphere shaped grains.

For the embodiment described here, an example is shown where Ti is used as the contact metal 9, but it is also acceptable to use Ta, W, Mo, Pt, etc., instead of Ti. In addition, silicides such as titanium silicide, tantalum silicide, tungsten silicide, molybdenum silicide, platinum silicide, etc., are also acceptable.

Further, for the embodiment described here, TiN is used as the rugged electrode metal 14, but instead of TiN, it is also acceptable to use metal nitrides such as tungsten nitride (WN), molybdenum nitride (MoN), etc., or alloys such as titanium tungsten (TiW), tungsten silicide (WSi) etc., or their nitride compounds such as, TiWN, WSiN, etc.

Further, for the embodiment described here, $Ta_2O_5$ is used as the capacitor insulator layer 11, but rutile ($TiO_2$), strontium titanium oxide ($SrTiO_3$), zirconium titanium oxide lead (PZT), etc., can also be used. In the case where the rutile is used, as explained later for the embodiment of the third semiconductor integrated circuit device of this invention, the processing steps are reduced and yield is increased by using TiN as the rugged electrode metal and oxidizing its surface. Also, the possibility of practical applications for Si LSI processing can be improved by forming the electrode metal and the capacitor insulator layer with only Ti which is a well known material and in which previous results are available.

Figure 5A:
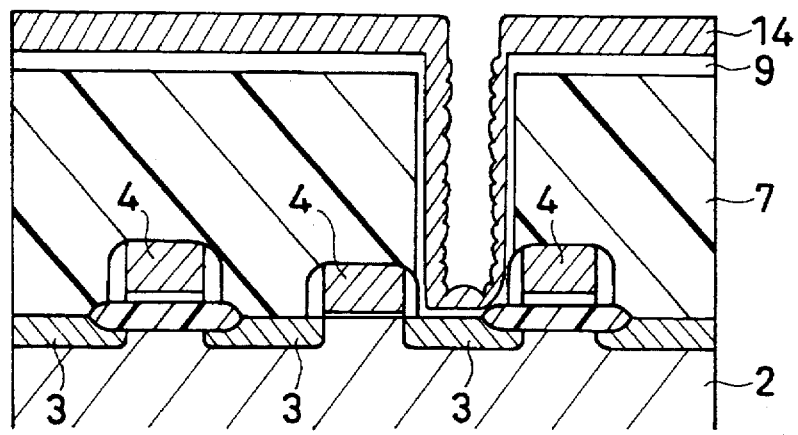
FIGS. 5A–5C are diagrammatic sectional views of a semiconductor integrated circuit device which has features of all of the first to third semiconductor integrated circuit devices for use in explaining the process steps for fabricating such a device according to the invention.
Figure 5B:
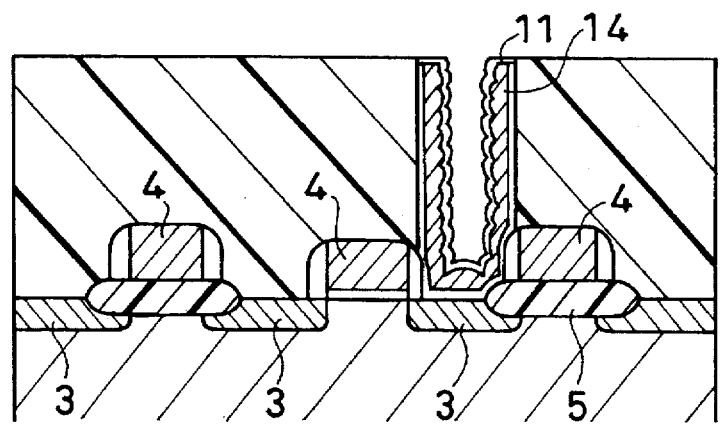
Figure 5C:
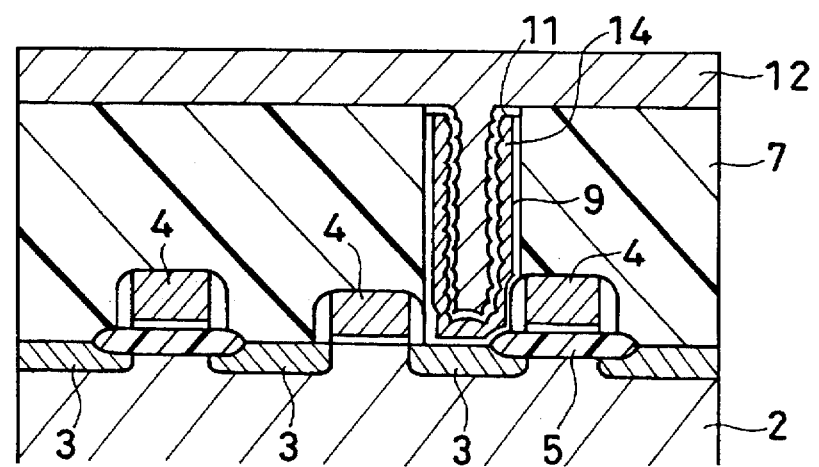

In the capacitance formed in this embodiment, because the dielectric constant of $Ta_2O_5$ is about a factor of 6 greater than that of the silicon oxide layer, the capacitance is about 20 fF inside the contact hole alone if the effect of the surface area increase is included. In the case where rutile is used, the capacitance inside the contact hole only becomes about 100 fF, and in this case the capacitance necessary for a memory cell is well satisfied by the capacitance inside the contact hole only. In the case where the capacitance is formed in the contact hole only, the surface can be planarized after the formation of memory cells, and the processing subsequent to the formation of interconnections is made easier. This type of structure is explained next as an embodiment provided with features of all of the first to third semiconductor integrated circuit devices of this invention. FIGS. 5a–5C are used for explaining the configuration of the embodiment provided with the features of the first to third semiconductor integrated circuit devices. First, as shown in FIG. 1A, a memory cell constituted by a MOS transistor 1 is fabricated on a silicon substrate 2. The MOS transistor is composed of a diffusion layer 3 that constitutes a source/drain and a gate electrode, and is electrically insulated by a device isolation layer 5 from neighboring gate electrodes or diffusion layers of a transistor. Also, a side wall 6 composed of a silicon oxide layer and a silicon nitride layer is provided at the side surface of the gate electrode 4. Furthermore, the transistor is covered with an interlayer insulator layer 7 composed of silicon oxide etc., and as shown in FIG. 1A, in the case of this embodiment, the interlayer insulator layer surface is planarized. The planarization is carried out by etch-back using reactive ion etching (RIE) or chemical mechanical polishing (CMP). Although planarization is carried out in this case, it is also acceptable if the planarization is not carried out. The gate width of the gate electrode is 0.2 μm and the thickness of the interlayer insulator layer is 0.6 μm.

Next, as shown in FIG. 1B, the contact hole 8 having a diameter of 0.25μm is formed in the interlayer insulator layer by standard photolithography and RIE of the oxide layer. The process is the same as the processes for the first, second and third semiconductor integrated circuit devices of this invention.

Next, as shown in FIG. 5A, a contact metal (Ti) 9 is deposited by collimated sputtering over the entire surface and, with a layer of a sufficient thickness being deposited in the bottom of the contact hole, titanium silicide is formed by a reaction with the Si below. In ionized beam deposition, for example, titanium (Ti) is used as the source, is evaporated in a vacuum chamber, and is made to collide with electrons so as to be made into positive ions, whereby a negative voltage is applied to the substrate. By doing this, the ionized Ti is given directionality by the electric field, and travels flying in a perpendicular direction (parallel to the contact hole) with respect to the substrate. Also, nitrogen is introduced into the evaporation chamber, which reacts with Ti and TiN is deposited on the substrate. In this case, according to experiment, TiN is deposited as a rugged pillar shape inside the contact hole as shown in FIG. 5A.

In the process for forming the series of contact metals 9 and rugged metal electrode 19 of FIG. 5A, instead of the deposition of the contact metal (Ti) 9 and the rugged electrode metal (TiN) 14, it is also acceptable to simultaneously carry out the processes for the formation of the rugged TiN electrode metal and the silicide by nitridation of the surface of Ti, wherein the rugged electrode metal layer composed of Ti is deposited using ionized evaporation so as to be the contact metal and metal electrode, and then is heat treated at about 700° C. in a nitrogen ambient.

Next, the rugged metal electrode 14 and contact metal 9, except those inside the contact hole 8, are removed by chemical mechanical polishing (CMP). At this time, it is also acceptable to use a process wherein photoresist is applied to the entire surface, the contact hole is filled and planarized and, after etch-back removal of the photoresist and contact metal 9 by RIE or argon ion milling, the photoresist is dissolved and removed by an organic solvent.

Next, as shown in FIG. 5B, the capacitor insulator layer (rutile) 11 is formed on the surface of the rugged metal electrode 14 and contact metal 9. The capacitor insulator layer is heat processed in an electric furnace or a lamp furnace in an oxygen ambient at a temperature above 500° C. and a layer of 10 nm thickness is formed. At this time, it is necessary to oxidize not only the rugged electrode metal surface but also the surface of the contact hole opening section of the contact metal 9 whereby an insulator layer is formed.

Next, as shown in FIG. 5C, the contact hole is filled by depositing upper electrode metal 12 (TiN) of a thickness of only 200 nm by the MOCVD method.

The device of the embodiment provided with the features of the first, second, and third semiconductor integrated circuits devices of this invention fabricated in this way constitutes a DRAM memory cell where a capacitance of 100 fF can be maintained. Also, in the case where a capacitance of about 30 fF is sufficient, it is acceptable to make the thickness of the interlayer insulator layer 7 to be 200 nm which is ⅓ of the thickness used in this embodiment.

Further, in this embodiment, the capacitor insulator layer of rutile is formed by the oxidation of the electrode metal that is composed of tantalum nitride, but in the same way, it is also acceptable to form tantalum pentaoxide by the oxidation of Ta or TaN instead of the rutile. Also, it is acceptable to deposit rutile, $Ta_2O_5$, $SrTiO_3$, PZT, etc., by the CVD method without using the method for fabricating the third semiconductor circuit device of the invention. However, in such a case, in the same way as in this embodiment, it is necessary to carry out insulation processing by surface oxidation, etc. after the etch-back subsequent to the formation of the capacitor insulator layer so as to ensure that the pair of electrode metals sandwiching the capacitor insulator layer are insulated with each other.

Also, in this embodiment, Ti is used as the contact metal, but it is also acceptable to use metals such as Ta, W, Mo, Pt, etc., or silicide alloys such as TaSi, TiSi, WSi, PtSi, MoSi, etc., or alloys such as Ti-Ta, etc.

Further, it is also acceptable to use W, Mo, TiW, Pt, WN, MoN, TiWN, WSi, WSiN etc., instead of TiN as the upper electrode metal.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a semiconductor integrated circuit device including a switching transistor having a conducting region, comprising the steps of:

forming a contact hole in an insulator layer;

depositing an electrode metal having a thickness smaller than the diameter of the contact hole on a surface of the insulator layer so that the electrode metal is directly electrically connected to the conducting region of the switching transistor;

polishing and removing the electrode metal existing in portions other than an inner periphery of the contact hole; and forming a capacitor insulator layer on a surface of the electrode metal, said capacitor insulator layer and said electrode metal comprising a common metal.

2. The method for fabricating a semiconductor integrated circuit device according to claim 1, wherein the electrode metal is formed from TiN and the capacitor insulator layer is formed from TiO$_2$.

3. The method for fabricating a semiconductor integrated circuit device according to claim 1, wherein the electrode metal and the capacitor insulator layer are formed integrally.

4. The method for fabricating a semiconductor integrated circuit device according to claim 1, further comprising the step of depositing a contact metal on the surface of the insulator layer prior to depositing the electrode metal so that the electrode metal is electrically connected to the conducting region of the switching transistor through the contact metal.

5. The method for fabricating a semiconductor integrated circuit device according to claim 4, wherein the contact metal is formed from Ti.

6. The method for fabricating a semiconductor integrated circuit device according to claim 1, further comprising the step of depositing an upper electrode metal over the capacitor layer.

7. The method for fabricating a semiconductor integrated circuit device according to claim 6, wherein the upper electrode metal is formed from TiN.

* * * * *